（12）United States Patent
Jung

(10) Patent No.: US 10,700,670 B2
(45) Date of Patent: Jun. 30, 2020

(54) VOLTAGE CONTROL CIRCUIT

(71) Applicant: Samsung Electro-Mechanics Co., Ltd., Suwon-si (KR)

(72) Inventor: Nak Jun Jung, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/202,402

(22) Filed: Nov. 28, 2018

(65) Prior Publication Data

US 2019/0393865 A1 Dec. 26, 2019

(30) Foreign Application Priority Data

Jun. 22, 2018 (KR) .......................... 10-2018-0071969

(51) Int. Cl.
*H03K 3/3565* (2006.01)

(52) U.S. Cl.
CPC .................... *H03K 3/3565* (2013.01)

(58) Field of Classification Search
CPC ...... H03K 3/00; H03K 3/013; H03K 3/02337; H03K 3/0377; H03K 3/3565; H03K 5/00; H03K 5/2481
USPC .......................................................... 327/206
See application file for complete search history.

(56) References Cited

U.S. PATENT DOCUMENTS

| | | | | |
|---|---|---|---|---|
| 5,274,323 A | * | 12/1993 | Dobkin .................... | G05F 1/573 323/273 |
| 6,008,627 A | * | 12/1999 | Narita ..................... | H01M 2/34 320/134 |
| 6,469,481 B1 | * | 10/2002 | Tateishi ............... | H02M 3/1588 323/282 |
| 7,242,168 B2 | * | 7/2007 | Muller ................ | H02M 3/1582 323/222 |
| 2008/0218236 A1 | * | 9/2008 | Liu ........................ | H03H 11/26 327/263 |
| 2018/0376555 A1 | * | 12/2018 | Wang .................. | H05B 33/0845 |

FOREIGN PATENT DOCUMENTS

KR 1999-0040371 A 6/1999

OTHER PUBLICATIONS

Schematic Collections—XREL Semiconductor.pdf (Year: 2018).*
DS-0033-11-XTR431-High-Temperature Programmable Shunt Regulator.pdf (Year: 2018).*

* cited by examiner

*Primary Examiner* — Lincoln D Donovan
*Assistant Examiner* — Dave Mattison
(74) *Attorney, Agent, or Firm* — NSIP Law

(57) ABSTRACT

A voltage control circuit includes: a voltage detection circuit configured to detect an input voltage input through an input terminal, and to provide a detection voltage based on the detecting of the input voltage; a comparison circuit configured to compare the detection voltage with a reference voltage, and to provide a comparison result signal based on a result of the comparing of the detection voltage with the reference voltage; a voltage switching circuit connected between the input terminal and an output terminal, and configured to selectively operate in either one of an ON state and an OFF state according to the comparison result signal; and a voltage dropping circuit connected to the voltage switching circuit in parallel, and configured to drop the input voltage to a dropped voltage and output the dropped voltage to the output terminal.

16 Claims, 5 Drawing Sheets

VOLTAGE CONTROL CIRCUIT

CROSS-REFERENCE TO RELATED APPLICATIONS

This application claims benefit under 35 U.S.C. § 119(a) of Korean Patent Application No. 10-2018-0071969, filed on Jun. 22, 2018 in the Korean Intellectual Property Office, the entire disclosure of which is incorporated herein by reference for all purposes.

BACKGROUND

1. Field

The following description relates to a voltage control circuit disposed between a power supply and a voltage converter such as a DC/DC converter.

2. Description of Related Art

In general, a system using a battery as a power supply may include a DC/DC converter configured to convert a voltage input from a battery. The cost of such a DC/DC converter may increase as the allowable range of an input voltage increases.

In the case of a low-cost DC/DC converter, an internal circuit of the DC/DC converter may be damaged when an input voltage exceeds an allowable voltage.

When a high-cost DC/DC converter is used to prevent damage to an internal circuit and to meet the required specification, costs may be increased to an undesirable level.

In the case of an input voltage having a wide range, a high-capacity passive element is required in the event that the duty of a DC/DC converter is reduced at a high voltage. For this reason, in applications requiring a high-capacity passive element, the high-capacity passive element may have an increased size and a decreased efficiency, in comparison to a relatively low-capacity passive element.

Moreover, a passive element such as an inductor needs to be additionally used to design a DC/DC converter having the wide range of an input voltage, which may lead to increases in size and cost as well as a decrease in efficiency.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a voltage control circuit includes: a voltage detection circuit configured to detect an input voltage input through an input terminal, and to provide a detection voltage based on the detecting of the input voltage; a comparison circuit configured to compare the detection voltage with a reference voltage, and to provide a comparison result signal based on a result of the comparing of the detection voltage with the reference voltage; a voltage switching circuit connected between the input terminal and an output terminal, and configured to selectively operate in either one of an ON state and an OFF state according to the comparison result signal; and a voltage dropping circuit connected to the voltage switching circuit in parallel, and configured to drop the input voltage to a dropped voltage and output the dropped voltage to the output terminal.

The voltage dropping circuit may be further configured to drop the input voltage below an allowable reference voltage, in response to the voltage switching circuit being in the OFF state.

The voltage detection circuit may include a first resistor and a second resistor connected in series between the input terminal and a ground, and may be configured to provide the detection voltage in a connection node of the first resistor and the second resistor.

The comparison circuit may include a shunt regulator including a cathode connected to the input terminal through a first bias resistor, an anode connected to the ground, and a control terminal configured to receive the detection voltage, the shunt regulator being configured to be turned on in response to the detection voltage being higher than the reference voltage. The comparison circuit may include a first MOS transistor including a drain connected to the voltage dropping circuit, a source connected to a ground, and a gate connected to the anode of the shunt regulator, the first MOS transistor being configured to be turned off, in response to the shunt regulator being turned on, to provide the comparison result signal, having a switched-off level, to the voltage switching circuit.

The voltage switching circuit may include a first switch component including a source and a drain connected between the input terminal and the output terminal, and a gate connected to the drain of the first MOS transistor, and a bias resistor connected to the gate of the first switch component and the input terminal. The first switch component may be configured to operate in an ON configuration to transmit the input voltage to the output terminal, in response to the detection voltage being lower than the reference voltage, and may be configured to operate in an OFF configuration, in response to the detection voltage being higher than the reference voltage.

The voltage dropping circuit may include a voltage dropping component connected to the voltage switching circuit in parallel. The voltage dropping component may be configured to drop the input voltage by a specified voltage, in response to the voltage switching circuit being in the OFF state.

The voltage control circuit may be connected to a battery and a DC/DC converter, and may be configured to receive the input voltage from the battery and output the dropped input voltage to the DC/DC converter from the output terminal.

In another general aspect, a voltage control circuit includes: a voltage detection circuit configured to detect a detection voltage in an input voltage input through an input terminal according to a variable detection rate; a Schmitt trigger circuit configured to compare the detection voltage with a reference voltage, and configured to vary the detection rate and to provide a comparison result signal based on a result of the comparing of the detection voltage with the reference voltage; a voltage switching circuit connected between the input terminal and an output terminal, and configured to selectively operate in either one of an ON state and an OFF state; and a voltage dropping circuit connected to the voltage switching circuit in parallel, and configured to drop the input voltage and output the dropped input voltage to the output terminal, in response to the voltage switching circuit being in the OFF state.

The voltage dropping circuit may be further configured to drop the input voltage below an allowable reference voltage, in response to the voltage switching circuit being in the OFF state.

The Schmitt trigger circuit may include a Schmitt trigger configured to compare the detection voltage with the reference voltage, and to vary the detection rate and provide the comparison result signal on the result of the comparing of the detection voltage with the reference voltage. The Schmitt trigger circuit may include a buffer circuit configured to transmit the comparison result signal to the voltage switching circuit.

The Schmitt trigger may include a shunt regulator including a cathode connected to the input terminal through a first bias resistor, an anode connected to a ground, and a control terminal configured to receive the detection voltage, the shunt regulator being configured to be turned on in response to the detection voltage being higher than the reference voltage. The Schmitt trigger may include a first MOS transistor including a drain connected to the input terminal through a second bias resistor, a source connected to a ground, and a gate connected to the cathode of the shunt regulator, the first MOS transistor being configured to be turned off, in conjunction with the shunt regulator being turned on, to provide the comparison result signal to the voltage switching circuit.

The buffer circuit may include a second MOS transistor including a drain connected to the input terminal through a bias resistor, a source connected to a ground, and a gate connected to the drain of the first MOS transistor. The buffer circuit may include a third MOS transistor including a drain connected to the voltage dropping circuit, a source connected to a ground, and a gate connected to the drain of the second MOS transistor.

The voltage detection circuit may include a first resistor and a second resistor connected between the input terminal and a ground in series, and a third resistor connected between the drain of the first MOS transistor and a detection node disposed between the first resistor and the second resistor, and configured to vary the detection rate at the detection node according to a switching operation of the first MOS transistor.

The voltage switching circuit may include a first switch component including a source and a drain connected between the input terminal and the output terminal, and a gate connected to the drain of the third MOS transistor, and a bias resistor connected to the gate of the first switch component and the input terminal. The first switch component may be configured to operate in an ON configuration based on the comparison result signal, in response to the detection signal being lower than the reference voltage, to transmit the input voltage to the output terminal, and may be configured to operate in an OFF configuration based on the comparison result signal, in response to the detection voltage being higher than the reference voltage.

The voltage dropping circuit may include a voltage dropping component connected to the voltage switching circuit in parallel. The voltage dropping component may be configured to drop the input voltage by a specified voltage, in response to the voltage switching circuit being in the OFF state.

The voltage control circuit may be connected to a battery and a DC/DC converter, and may be configured to receive the input voltage from the battery and output the dropped input voltage to the DC/DC converter from the output terminal.

Other features and aspects will be apparent from the following detailed description, the drawings, and the claims.

BRIEF DESCRIPTION OF DRAWINGS

FIG. 7 is a view of a level of a voltage in each node when a first MOS transistor in FIG. 3 is turned on.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
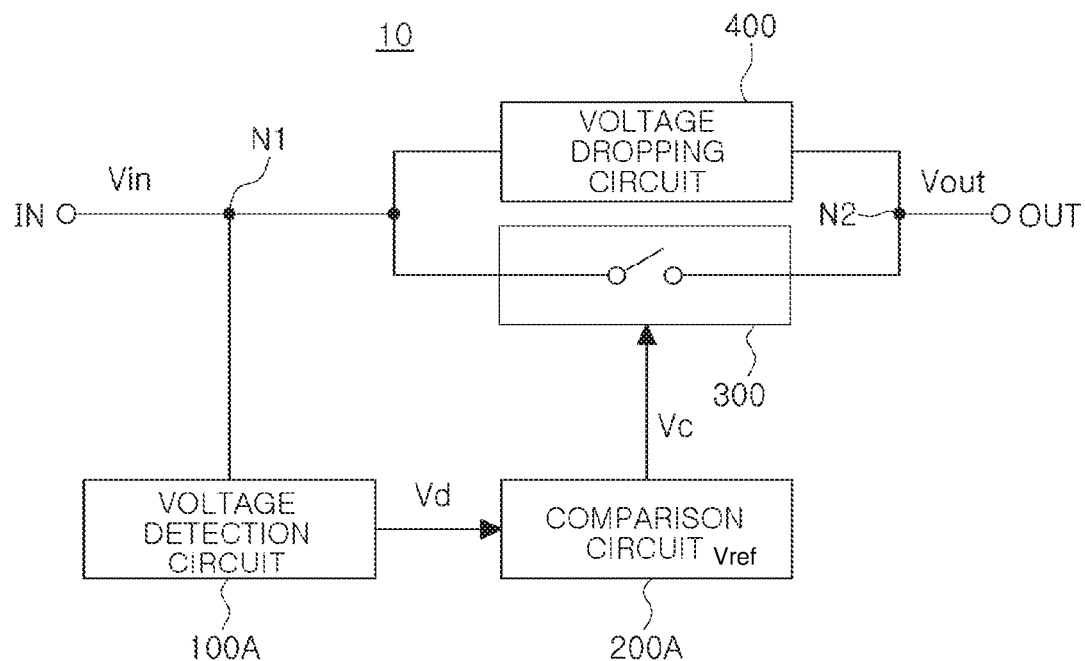
FIG. 1 is a view of a voltage control circuit, according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a view of a voltage control circuit 10, according to an example.

Referring to FIG. 1, the voltage control circuit 10 may include a voltage detection circuit 100A, a comparison circuit 200A, a voltage switching circuit 300, and a voltage dropping circuit 400.

The voltage detection circuit 100A may detect an input voltage Vin through an input terminal IN to provide a detection voltage Vd.

The comparison circuit 200A may compare the detection voltage Vd with a reference voltage Vref to provide a comparison result signal Vc based on a comparison result (i.e., a result of the comparing of the detection voltage Vd with the reference voltage Vref). The reference voltage Vref may be a voltage to determine an allowable upper limit voltage. As an example, the comparison circuit 200A may provide a comparison result signal Vc having a switching-off level when the detection voltage Vd is higher than the reference voltage Vref. As another example, the comparison circuit 200A may provide a comparison result signal Vc having a switching-on level when the detection voltage Vd is lower than the reference voltage Vref.

The voltage switching circuit 300 may be connected between the input terminal IN and an output terminal OUT to operate in an ON state or an OFF state depending on the comparison result signal Vc. As an example, the voltage switching circuit 300 may be in the ON state when the comparison result signal Vc has the switching-on level, and may be in the OFF state when comparison result signal Vc does not have the switching-on level.

The voltage dropping circuit 400 may connected to the voltage switching circuit 300 in parallel to drop the input voltage Vin to a dropped voltage, and to output the dropped voltage to the output terminal OUT. As an example, the voltage dropping circuit 400 may include at least one voltage dropping component such as a diode.

The voltage dropping circuit 400 may drop the input voltage Vin to a dropped voltage below an allowable reference voltage while the voltage switching circuit 300 is in the OFF state.

Figure 2:
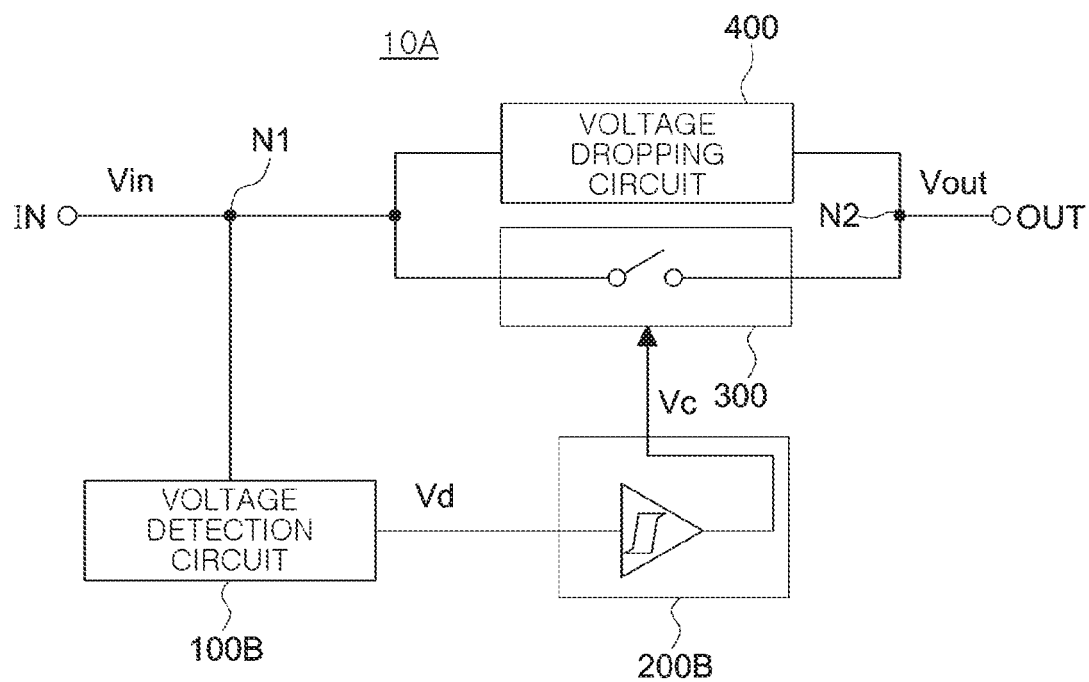
FIG. 2 is a view of a voltage control circuit, according to an example.

FIG. 2 is a view of a voltage control circuit 10A, according to an example.

Referring to FIG. 2, the voltage control circuit 10A may include a voltage detection circuit 100B, a Schmitt trigger circuit 200B, the voltage switching circuit 300, and the voltage dropping circuit 400.

The voltage detection circuit 100B may detect a detection voltage Vd in an input voltage Vin input through an input terminal IN according to a predetermined variable detection rate.

The Schmitt trigger circuit 200B may compare the detection voltage Vd with a reference voltage Vref to vary the detection rate according to a comparison result (i.e., a result of the comparing of the detection voltage Vd with the reference voltage Vref) and to provide a comparison result signal Vc according to the comparison result. The reference voltage Vref may be a voltage to determine an allowable upper limit voltage. As an example, the Schmitt trigger circuit 200B may provide a comparison result signal Vc having a switching-off level when the detection voltage Vd is higher than the reference voltage Vref. As another example, the Schmitt trigger circuit 200B may provide a comparison result signal Vc having a switching-on level when the detection voltage Vd is lower than the reference voltage Vref.

The voltage switching circuit 300 may be connected between the input terminal IN and an output terminal OUT to operate in an ON state or an OFF state depending on the comparison result signal Vc. As an example, the voltage switching circuit 300 may be in the ON state when the comparison result signal Vc has a switching-on level and may be in the OFF state when the comparison result signal Vc does not have the switching-on level.

The voltage dropping circuit 400 may be connected to the voltage switching circuit 300 in parallel to drop the input voltage Vin to a dropped voltage and to output the dropped voltage to the output terminal OUT when the voltage switching circuit 300 is in the OFF state. For example, the voltage dropping circuit 400 may include at least one voltage dropping component such as a diode.

The voltage dropping circuit 400 may drop the input voltage Vin below an allowable reference voltage while the voltage switching circuit 300 is in the OFF state.

Figure 3:
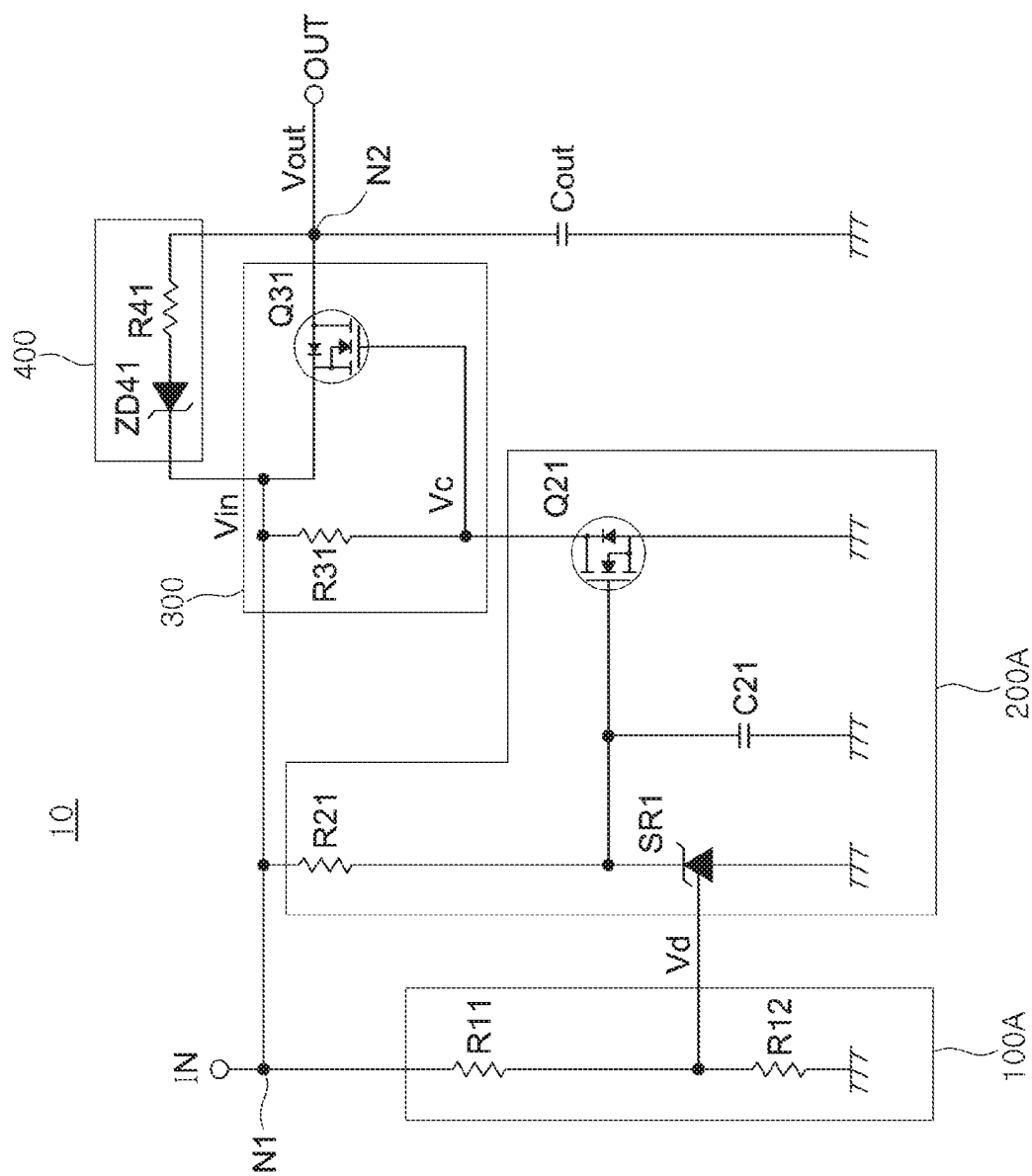
FIG. 3 is a detailed view of the voltage control circuit of FIG. 1.

FIG. 3 is a detailed view of the voltage control circuit 10 in FIG. 1.

Referring to FIGS. 1 and 3, the voltage detection circuit 100A may include a first resistor R11 and a second resistor R2 connected between the input terminal and a ground in series to provide the detection voltage Vd at a connection node of the first resistor R11 and the second resistor R12.

The comparison circuit 200A may include a shunt regulator SR1 and a first MOS transistor Q21.

The shunt regulator SR1 may include a cathode connected to the input terminal IN through a first bias resistor R21, an anode connected to a ground, and a control terminal configured to receive the detection voltage Vd. The shunt regulator SR1 is in an ON state when the detection voltage Vd is higher than the reference voltage Vref, and is in an OFF state when the detection voltage Vd is not higher than the reference voltage Vref.

The first MOS transistor Q21 may include a drain connected to the voltage dropping circuit 400, a source connected to a ground, and a gate connected to the anode of the shunt regulator SR1. A capacitor C21 may be connected between the gate of the first MOS transistor Q21 and the ground. As an example, the first MOS transistor Q21 may be turned off in response to a turning-on operation of the shunt regulator SR1 to provide the comparison result signal Vc having the switching-off level to the voltage switching circuit 300. On the other hand, the first MOS transistor Q21 may be turned on in response to a turning-off operation of the shunt regulator SR1 to provide the comparison result signal Vc having the switching-on level to the voltage switching circuit 300.

The voltage switching circuit 300 may include a source and a drain connected between the input terminal IN and the output terminal OUT, a first switch component Q31 having a gate connected to the drain of the first MOS transistor Q21, and a bias resistor R31 connected between the gate of the first switch component Q31 and the input terminal IN.

The first switch component Q31 may operate in an ON state in response to the comparison result signal Vc having a low level when the detection signal Vd is lower than the reference voltage Vref, to transmit the input voltage Vin to the output terminal OUT. The first switch circuit Q31 may operate in an OFF state in response to the comparison result signal having a high level when the detection voltage Vd is higher than the reference voltage Vref.

The voltage dropping circuit 400 may include at least one drop component ZD41 connected to the voltage switching circuit 300 in parallel. For example, the at least one drop component ZD41 may include a single Zener diode (or a single voltage regulator diode) or a plurality of voltage regulator diodes connected in series, but the voltage dropping circuit 400 is not limited to such diodes. The voltage dropping circuit 400 may include a circuit or a component configured to drop a voltage by a predetermined constant voltage. In FIG. 3, R41 is a resistor.

The voltage dropping component ZD41 may drop the input voltage Vin by a predetermined voltage when the voltage switching circuit 300 is in the OFF state. For example, when the voltage switching circuit 300 is in the ON state, there is no substantial difference in voltage between both ends of the voltage dropping circuit 400. Accordingly, the voltage dropping circuit 400 does not operate.

Figure 4:
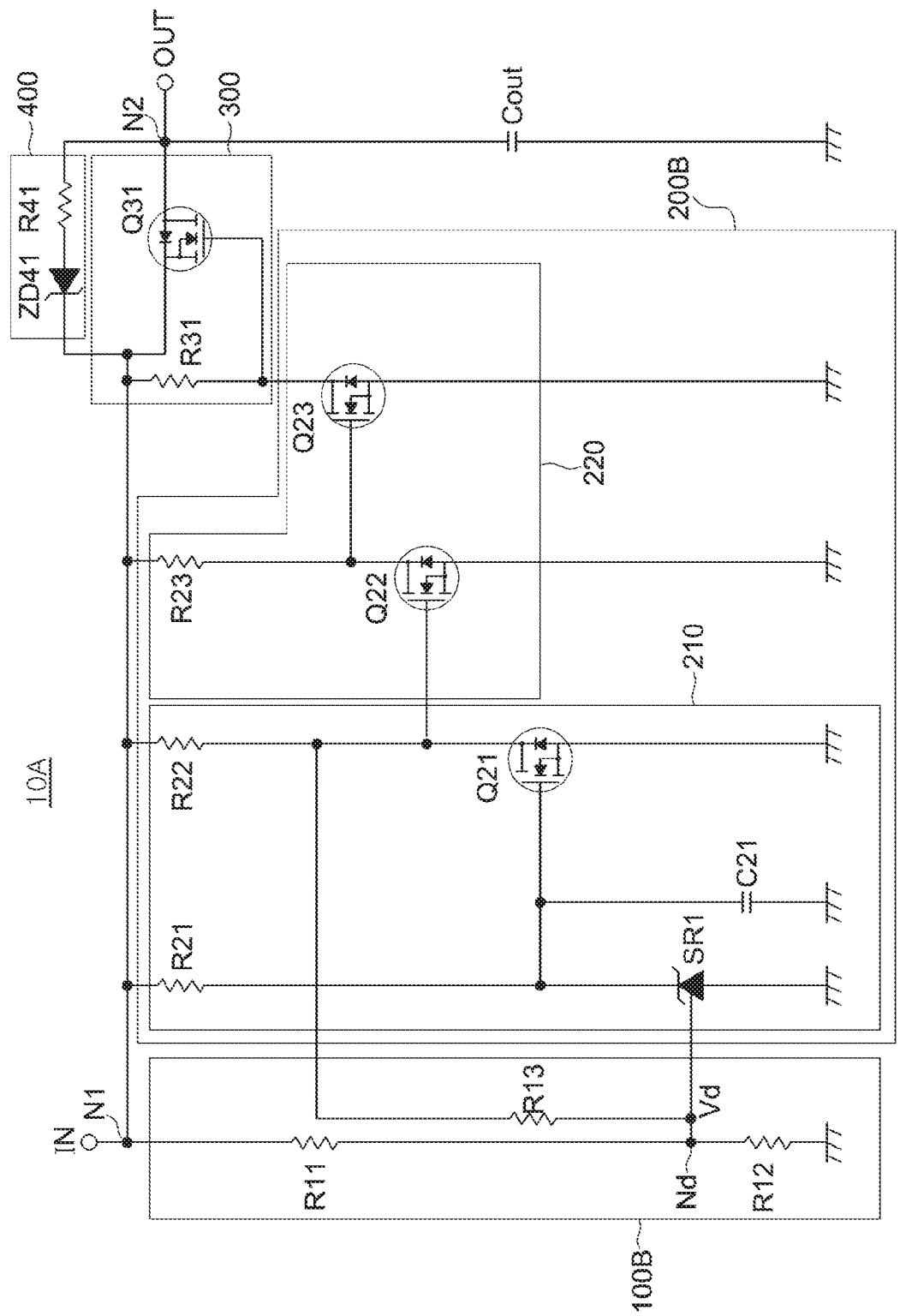
FIG. 4 is a detailed view of the voltage control circuit of FIG. 2.

FIG. 4 is a detailed view of the voltage control circuit 10A in FIG. 2.

Referring to FIGS. 2 and 4, the voltage detection circuit 100B may include the first resistor R11 and the second resistor R12 connected in series between the input terminal IN and a ground, and a third resistor R13 connected between a detection node Nd between the first and second resistors R11 and R12 and the Schmitt trigger circuit 200B.

The Schmitt trigger circuit 200B may include a Schmitt trigger 210 and a buffer circuit 220.

The Schmitt trigger 210 compares the detection voltage Vd with the reference voltage Vref to vary the detection rate according to the comparison result and to provide the comparison result signal Vc according to the comparison result. The buffer circuit 220 may transmit the comparison result signal Vc to the voltage switching circuit 300.

The Schmitt trigger 210 may include the shunt regulator SR1 and the first MOS transistor Q21.

The shunt regulator SR1 may include a cathode connected to the input terminal IN through the first bias resistor R21, an anode connected to a ground, and a control terminal configured to receive the detection voltage Vd. As an example, the shunt regulator SR1 may be in an ON state when the detection voltage Vd is higher than the reference voltage Vref, and may be in an OFF state when the detection voltage Vd is not higher than the reference voltage Vref.

The first MOS transistor Q21 may include a drain connected to the input terminal IN through a second bias resistor R22, a source connected to a ground, and a gate connected to the cathode of the shunt regulator SR1. As an example, the first MOS transistor Q21 may be turned off in conjunction with a turning-on operation of the shunt regulator to provide the comparison result signal Vc having a switching-off level to the voltage switching circuit 300. On the other hand, the first MOS transistor Q21 may be turned on in conjunction with a turning-off operation of the shunt regulator SR1 to provide the comparison result signal Vc having a switching-on level to the voltage switching circuit 300.

The buffer circuit 220 may include a second MOS transistor Q22 and a third MOS transistor Q23.

The second MOS transistor Q22 may include a drain connected to the input terminal IN through a third bias resistor R23, a source connected to a ground, and a gate connected to the drain of the first MOS transistor Q21.

The third MOS transistor Q23 may include a drain connected to the voltage dropping circuit 400, a source connected to a ground, and a gate connected to the drain of the second MOS transistor Q22.

For example, the second MOS transistor Q22 and the third MOS transistor Q23 may perform a switching operation in conjunction with a switching operation of the first MOS transistor Q21. As an example, when the first MOS transistor Q21 enters an ON state, the second MOS transistor Q22 and the third MOS transistor Q23 may enter an OFF state and an ON state, respectively. In this case, a comparison result signal Vc having a low level may be provided.

When the first MOS transistor Q21 enters an OFF state, the second MOS transistor Q22 and the third MOS transistor Q23 may enter an ON state and an OFF state, respectively. In this case, a comparison result signal Vc having a high level may be provided.

The voltage detection circuit 100B may include the first resistor R11 and the second resistor R12 connected in series between the input terminal IN and a ground, and the third resistor R13 connected between the detection node Nd between the first and second resistors R11 and R12 and the drain of the first MOS transistor Q21, to vary the detection rate at the detection node Nd according to the switching operation of the first MOS transistor Q21.

As an example, when the first MOS transistor Q21 is in an OFF state, the third resistor R13 is connected to the second bias resistor R22 connected to the drain of the first MOS transistor Q21 in series, to be connected to the first resistor R11 in parallel. In this case, the detection voltage Vd at the detection node Nd may be calculated using the following Equation (1), wherein the sign '//' between R11 and (R13+R22) indicates a parallel sum operation of resistors.

$$Vd=(R12)/(R12+(R11//(R13+R22)))\times Vin \qquad \text{Equation (1):}$$

As another example, when the first MOS transistor Q21 is in an ON state, the third resistor R13 is grounded through the first MOS transistor Q21 to be connected in parallel to the second resistor R12. In this case, the detection voltage Vd at the detection node Nd may be calculated using the following Equation (2), wherein the sign '//' between R12 and R13 indicates a parallel sum operation of resistors.

$$Vd=(R12//R13)/(R11+(R12//R13))\times Vin \qquad \text{Equation (2):}$$

The voltage switching circuit 300 may include the source and the drain connected between the input terminal IN and the output terminal OUT, the first switch component Q31 having a gate connected to the drain of the third MOS transistor Q23, and the bias resistor R31 connected to the gate of the first switch component Q31 and the input terminal IN.

As an example, when the detection voltage Vd is lower than the reference voltage Vref, the first switch component Q31 may operate in an ON state in response to the comparison result signal Vc having a low level, to transmit the input voltage Vin to the output terminal OUT. On the other hand, when the detection voltage Vd is higher than the reference voltage Vref, the first switch component Q31 may operate in an OFF state in response to the comparison result signal having a high level.

The voltage dropping circuit 400 includes the voltage dropping component ZD41 connected to the voltage switching circuit 300 in parallel. The voltage dropping component ZD41 may drop the input voltage Vin by a predetermined voltage when the voltage switching circuit 300 is in an OFF state.

Since the voltage switching circuit 300 and the voltage dropping circuit 400 shown in FIG. 4 have the same structures and perform the same operations shown and described with respect to FIG. 3, their detailed explanations will be omitted herein.

Figure 5:
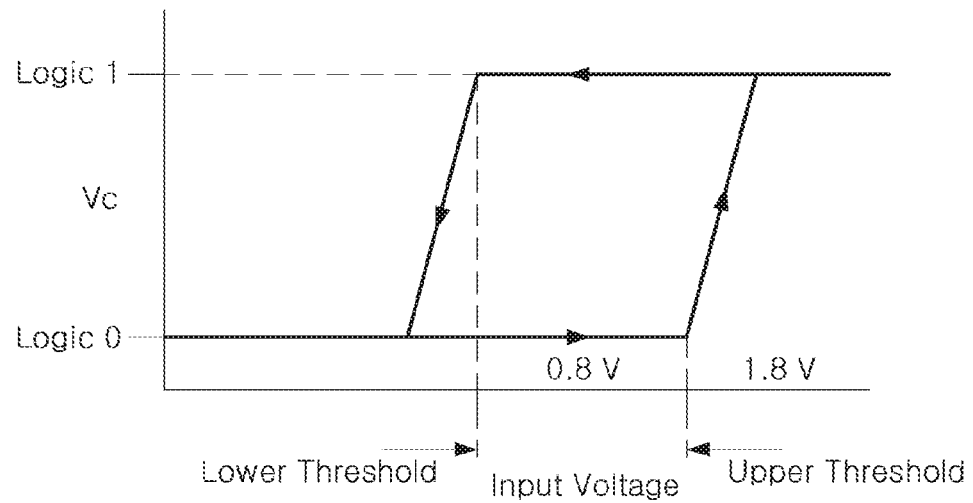
FIG. 5 illustrates a hysteresis operation of a Schmitt trigger circuit, according to an example.

FIG. 5 illustrates a hysteresis operation of the Schmitt trigger circuit 200A, according to an example.

Referring to FIGS. 4 and 5, the Schmitt trigger 210 may perform a Schmitt trigger operation together with the voltage detection circuit 1006.

As an example, when the shunt regulator SR1 is in an OFF state and the first MOS transistor Q21 is in an ON state, the detection voltage Vd applied to a control terminal of the shunt regulator SR1 may be detected at a relatively low detection rate according to the Equation (2). Thus, the shunt regulator SR1 may enter an ON state at a relatively high voltage (for example, 1.8 volts in FIG. 5) or above.

As another example, when the shunt regulator SR1 is in an ON state and the first MOS transistor Q21 is in an OFF state, the detection voltage Vd applied to the control terminal of the shunt regulator SR1 may be detected at a relatively high detection rate according to the Equation (1). Thus, the shunt regulator SR1 may enter an OFF state at a relatively low voltage (for example, 0.8 volt in FIG. 5, or below).

Figure 6:
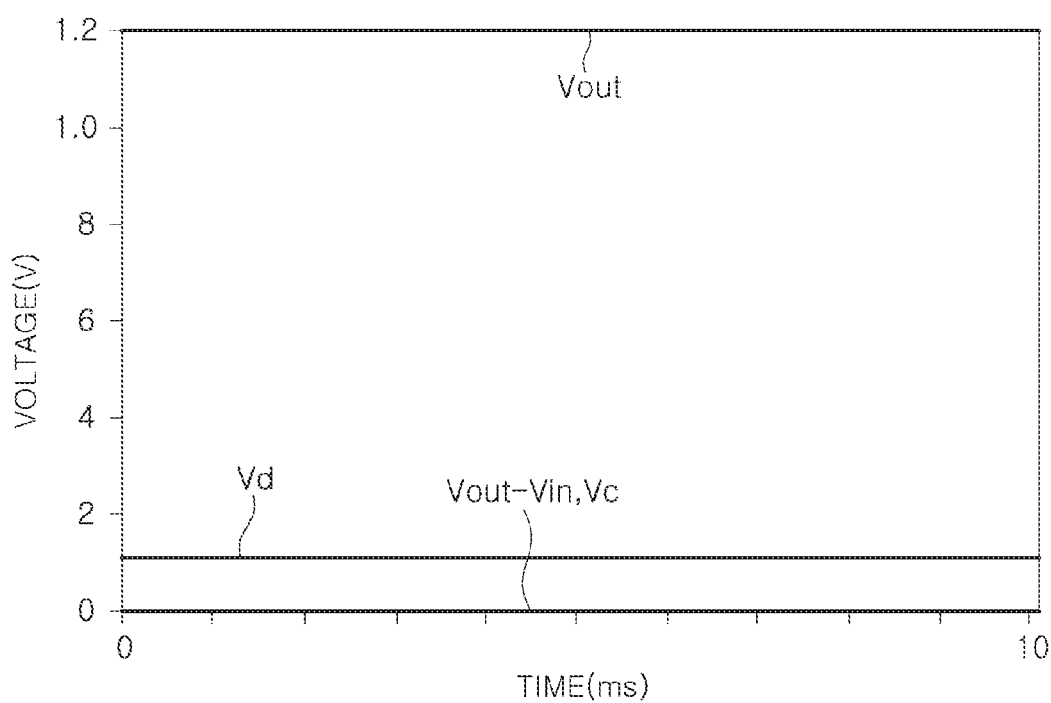
FIG. 6 is a view of a level of a voltage in each node when a first MOS transistor in FIG. 3 is turned off.
Figure 7:
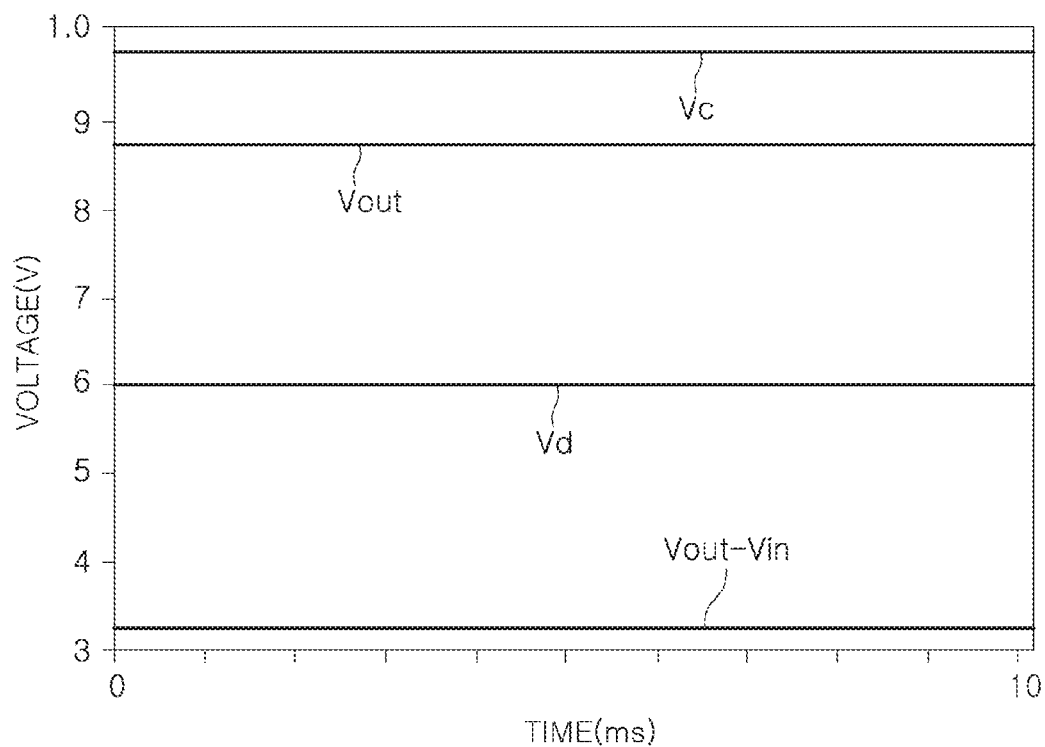

FIG. 6 is a view of a level of a voltage in each node when the first MOS transistor 21 in FIG. 3 is turned off. FIG. 7 is a view of a level of a voltage in each node when the first MOS transistor 21 in FIG. 3 is turned on.

In FIGS. 6 and 7, Vout is an output voltage of the voltage control circuit, Vd is a detection voltage, Vc is a voltage of a comparison result signal, and Vout-Vin is a difference between an output voltage and an input voltage which are the same as both end voltages of the voltage switching circuit 300.

In FIG. 6, when the first MOS transistor Q21 is turned off, Vd is 1.2 volts, Vc is zero (0) volts, and Vout is 12 volts. In FIG. 7, when the first MOS transistor Q21 is turned on, Vd is 6 volts, Vc is 9.8 volts, Vout-Vin is 3.2 volts, and Vout is 8.8 volts.

Figure 8:
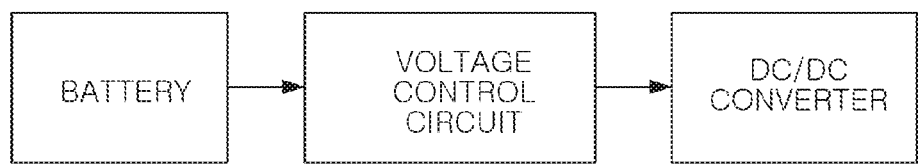
FIG. 8 is a view of an application of a voltage control circuit, according to an example.

FIG. 8 is a view of an application of a voltage control circuit, according to an example.

Referring to FIG. 8, a voltage control circuit may receive a battery voltage from a battery, and may control the battery voltage and output the controlled battery voltage to a DC/DC converter. In this case, the DC/DC converter may receive the controlled battery voltage to prevent a high voltage from being directly applied from the battery.

The voltage control circuit, while not being limited to FIG. 8, may be applied to a circuit and a device in which voltage control is required.

As described above, when a voltage higher than an allowable upper limit voltage is input, the input voltage may be dropped to provide a voltage lower than the allowable upper limit voltage.

In the case of applying the voltage control circuit to a DC/DC converter, a low-cost DC/DC converter may be used rather than a high-cost DC/DC converter.

In the case in which a DC/DC converter is designed, the range of a voltage input to the DC/DC converter (input voltage range) may be reduced to decrease a size of a passive component (e.g., inductor) included in the DC/DC converter and to improve efficiency of the DC/DC converter.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A voltage control circuit, comprising:
   a voltage detection circuit configured to detect an input voltage input through an input terminal, and to provide a detection voltage based on the detecting of the input voltage;
   a comparison circuit configured to compare the detection voltage with a reference voltage, and to provide a comparison result signal based on a result of the comparing of the detection voltage with the reference voltage;
   a voltage switching circuit connected between the input terminal and an output terminal, and configured to selectively operate in either one of an ON state and an OFF state according to the comparison result signal; and
   a voltage dropping circuit connected to the voltage switching circuit in parallel, and configured to drop the input voltage and output the dropped input voltage to the output terminal.

2. The voltage control circuit of claim 1, wherein the voltage dropping circuit is further configured to drop the input voltage below an allowable reference voltage, in response to the voltage switching circuit being in the OFF state.

3. The voltage control circuit of claim 1, wherein the voltage detection circuit comprises a first resistor and a second resistor connected in series between the input terminal and a ground, and is configured to provide the detection voltage in a connection node of the first resistor and the second resistor.

4. The voltage control circuit of claim 3, wherein the comparison circuit comprises
   a shunt regulator comprising a cathode connected to the input terminal through a first bias resistor, an anode connected to the ground, and a control terminal configured to receive the detection voltage, the shunt regulator being configured to be turned on in response to the detection voltage being higher than the reference voltage, and a first MOS transistor comprising a drain connected to the voltage dropping circuit, a source connected to a ground, and a gate connected to the cathode of the shunt regulator, the first MOS transistor being configured to be turned off, in response to the shunt regulator being turned on, to provide the comparison result signal, having a switched-off level, to the voltage switching circuit.

5. The voltage control circuit of claim 4, wherein the voltage switching circuit comprises
a first switch component comprising a source and a drain connected between the input terminal and the output terminal, and a gate connected to the drain of the first MOS transistor, and
a bias resistor connected to the gate of the first switch component and the input terminal, and
wherein the first switch component is configured to operate in an ON configuration to transmit the input voltage to the output terminal, in response to the detection voltage being lower than the reference voltage, and is configured to operate in an OFF configuration, in response to the detection voltage being higher than the reference voltage.

6. The voltage control circuit of claim 5, wherein the voltage dropping circuit comprises a voltage dropping component connected to the voltage switching circuit in parallel, and
the voltage dropping component is configured to drop the input voltage by a specified voltage, in response to the voltage switching circuit being in the OFF state.

7. The voltage control circuit of claim 1, wherein the voltage control circuit is connected to a battery and a DC/DC converter, and is configured to receive the input voltage from the battery and output the dropped input voltage to the DC/DC converter from the output terminal.

8. A voltage control circuit, comprising:
a voltage detection circuit configured to detect a detection voltage in an input voltage input through an input terminal according to a variable detection rate;
a Schmitt trigger circuit configured to compare the detection voltage with a reference voltage, and configured to vary the detection rate and to provide a comparison result signal based on a result of the comparing of the detection voltage with the reference voltage;
a voltage switching circuit connected between the input terminal and an output terminal, and configured to selectively operate in either one of an ON state and an OFF state; and
a voltage dropping circuit connected to the voltage switching circuit in parallel, and configured to drop the input voltage and output the dropped input voltage to the output terminal, in response to the voltage switching circuit being in the OFF state.

9. The voltage control circuit of claim 8, wherein the voltage dropping circuit is further configured to drop the input voltage below an allowable reference voltage, in response to the voltage switching circuit being in the OFF state.

10. The voltage control circuit of claim 8, wherein the Schmitt trigger circuit comprises
a Schmitt trigger configured to compare the detection voltage with the reference voltage, and to vary the detection rate and provide the comparison result signal on the result of the comparing of the detection voltage with the reference voltage, and
a buffer circuit configured to transmit the comparison result signal to the voltage switching circuit.

11. The voltage control circuit of claim 10, wherein the Schmitt trigger comprises
a shunt regulator comprising a cathode connected to the input terminal through a first bias resistor, an anode connected to a ground, and a control terminal configured to receive the detection voltage, the shunt regulator being configured to be turned on in response to the detection voltage being higher than the reference voltage, and
a first MOS transistor comprising a drain connected to the input terminal through a second bias resistor, a source connected to a ground, and a gate connected to the cathode of the shunt regulator, the first MOS transistor being configured to be turned off, in conjunction with the shunt regulator being turned on, to provide the comparison result signal to the voltage switching circuit.

12. The voltage control circuit of claim 11, wherein the buffer circuit comprises
a second MOS transistor comprising a drain connected to the input terminal through a bias resistor, a source connected to a ground, and a gate connected to the drain of the first MOS transistor, and
a third MOS transistor comprising a drain connected to the voltage dropping circuit, a source connected to a ground, and a gate connected to the drain of the second MOS transistor.

13. The voltage control circuit of claim 11, wherein the voltage detection circuit comprises
a first resistor and a second resistor connected between the input terminal and a ground in series, and
a third resistor connected between the drain of the first MOS transistor and a detection node disposed between the first resistor and the second resistor, and configured to vary the detection rate at the detection node according to a switching operation of the first MOS transistor.

14. The voltage control circuit of claim 12, wherein the voltage switching circuit comprises
a first switch component comprising a source and a drain connected between the input terminal and the output terminal, and a gate connected to the drain of the third MOS transistor, and
a bias resistor connected to the gate of the first switch component and the input terminal, and
wherein the first switch component is configured to operate in an ON configuration based on the comparison result signal, in response to the detection signal being lower than the reference voltage, to transmit the input voltage to the output terminal, and is configured to operate in an OFF configuration based on the comparison result signal, in response to the detection voltage being higher than the reference voltage.

15. The voltage control circuit of claim 14, wherein the voltage dropping circuit comprises a voltage dropping component connected to the voltage switching circuit in parallel, and
the voltage dropping component is configured to drop the input voltage by a specified voltage, in response to the voltage switching circuit being in the OFF state.

16. The voltage control circuit of claim 8, wherein the voltage control circuit is connected to a battery and a DC/DC converter, and is configured to receive the input voltage from the battery and output the dropped input voltage to the DC/DC converter from the output terminal.

\* \* \* \* \*